United States Patent [19]
Franke et al.

[11] Patent Number: 5,185,293
[45] Date of Patent: Feb. 9, 1993

[54] METHOD OF FORMING AND ALIGNING PATTERNS IN DEPOSTED OVERLAYING ON GAAS

[75] Inventors: Hans G. Franke, Hilton; Eric T. Prince, Fairport, both of N.Y.

[73] Assignee: Eastman Kodak Company, Rochester, N.Y.

[21] Appl. No.: 866,716

[22] Filed: Apr. 10, 1992

[51] Int. Cl.$^5$ .................. H01L 21/283; H01L 21/31
[52] U.S. Cl. .................. 437/184; 437/161; 437/228; 437/944; 437/962; 156/643; 156/646; 156/656; 156/659.1; 148/DIG. 105; 148/DIG. 106
[58] Field of Search .......... 437/944, 962, 184, 203, 437/228, 161; 748/DIG. 105, DIG. 106; 156/659.1, 656, 643, 646

[56] References Cited

U.S. PATENT DOCUMENTS

| | | |
|---|---|---|
| 4,004,341 | 1/1977 | Tung .................. 437/184 |
| 4,053,350 | 10/1977 | Olsen et al. .......... 437/962 |
| 4,352,716 | 10/1982 | Schaible et al. ...... 156/643 |
| 4,429,452 | 2/1984 | Meignant ............. 437/184 |
| 4,742,026 | 5/1988 | Vatus et al. ......... 437/245 |
| 4,824,800 | 4/1989 | Takano ............... 437/180 |
| 5,091,047 | 2/1992 | Cleeves et al. ....... 156/643 |
| 5,102,498 | 4/1992 | Itoh et al. .......... 156/659.1 |

FOREIGN PATENT DOCUMENTS 2-262342 10/1990 Japan .

OTHER PUBLICATIONS

Watanabe, et al., "Reverse Dry Etching...", *Japanese J. App. Phys.*, 30 (9A), Sep. 1991, pp. L1598-L1600.
Watanabe, ete al., "GaAs Dry Etching...", *Japanese J. App. Phys.* 30 (11B), Nov. 1991, pp. 3190-3194.
Uenishi et al., "Low Energy Etching...", *J. Vac. Sci. Technol.* B 70(1), Jan./Feb. 1992, pp. 67-70.
Kakuchi et al., "Amorphous Carbon Films...", *Appl. Phys. Lett.*, 48(13), 31 Mar. 1986, pp. 835-837.

*Primary Examiner*—T. N. Quach
*Attorney, Agent, or Firm*—Raymond L. Owens

[57] ABSTRACT

A method is described for forming patterns in deposited overlayers on GaAs and for aligning the formed patterns with etch features produced through dry processing. The deposited overlayers on GaAs are protected during pattern formation and subsequent processing by a durable, process integrable mask of hydrogenated amorphous carbon.

7 Claims, 3 Drawing Sheets

| Cap Layer: | n-GaAs | n=1e17 cm$^{-3}$ | 0.3 μm |
|---|---|---|---|
| Wide Gap Barrier Layer: | n-Al$_{0.5}$Ga$_{0.5}$As | n=1e17 cm$^{-3}$ | 0.6 μm |
| Cladding Layer: | p-Al$_{0.35}$Ga$_{0.65}$As | p=2e17 cm$^{-3}$ | 0.7 μm |
| Active Layer: | Al$_{0.05}$Ga$_{0.95}$As | | 0.1 μm |
| Cladding Layer: | n-Al$_{0.35}$Ga$_{0.65}$As | n=5e17 cm$^{-3}$ | 1.5 μm |
| Buffer Layer: | n-GaAs | n-1e18 cm$^{-3}$ | 0.7 μm |
| Substrate: | n-GaAs | n>1e18 cm$^{-3}$ | |

METHOD OF FORMING AND ALIGNING PATTERNS IN DEPOSTED OVERLAYING ON GAAS

CROSS-REFERENCE TO RELATED APPLICATION

Reference is made to commonly assigned copending application Ser. No. 679,843, filed Apr. 3, 1991 entitled "High Durability Mask for Dry Etch Processing of GaAs" by H. G. Franke and E. T. Prince, the teachings of which are incorporated herein.

FIELD OF THE INVENTION

This invention relates a method of forming patterns in deposited overlayers on GaAs and aligning said patterns with etch features produced by dry processing. More specifically, this invention relates a method of forming patterns in deposited overlayers on GaAs and aligning such patterns with etch features produced by dry processing.

BACKGROUND OF THE INVENTION

Integrated circuits in GaAs fabricated for optical and/or electronic device applications frequently incorporate features, e.g., mirrors/facets, channels and mesas, produced by dry etch processing. (The term GaAs as used herein includes all compounds, crystalline and polycrystalline, doped or undoped, containing gallium and arsenic with or without additional elements.) Often, in integrated circuits of this type, overlayers (metals and/or dielectrics) in device elements are required between dry etch features. This is true for certain active device elements such as laser diodes and photodiodes where metal overlayers are required as top surface electrical contacts. In a typical fabrication scheme for devices of this type electrical contacts are applied and patterned by lithographic means through separate process steps near the end of the process sequence. A method which permits the patterning of deposited overlayers, e.g., top surface contacts, concurrent with the patterning of other features during a process sequence, e.g., etch features, provides an advantage by reducing the number of process steps required Implementation of such a method, however, requires use of a suitable mask, i.e., a highly durable and process integrable mask, which will protect the overlayer from damage during patterning and subsequent processing. With reference again to top surface electrical contacts as deposited overlayers on integrated laser and photo diode elements, subsequent processing steps can include: an anneal at an elevated temperature to produce ohmic contact between the overlayer and the GaAs, lapping and polishing of the substrate backside, application of a backside electrical contact, another anneal at an elevated temperature to produce ohmic contact between the backside contact and the GaAs, one or more etch processes to produce isolation features/facets in the GaAs, removal of the protective mask, plus a number of cleaning procedures in solutions containing acids, bases, or solvents.

To prepare etch features in GaAs with small, often sub-micron size dimensions, processes which provide a high degree of anisotropy are often required. Wet processes are frequently unsuitable as they etch isotropically or crystallographically and undercut the mask. Dry processes, on the other hand, can, under suitable conditions, etch anisotropically and prevent mask undercut.

The majority of the dry processes that provide anisotropy in GaAs are ion-based techniques which utilize chemistry to provide some form of reactive assistance. The most common of the dry etch processes include: Reactive Ion Etching (RIE), Reactive Ion Beam Etching (RIBE), and Ion Beam Assisted Etching (IBAE) [also known as Chemically-Assisted Ion Beam Etching (CAIBE)]. The chemistry utilized by these techniques for reactive assistance enhances etch rates, forms volatile etch products, and minimizes (relative to non-chemically assisted processes) damage to the GaAs surface by energetic ions, neutrals, and/or radicals. In the dry etch processing of GaAs, ambients containing chlorine (atoms, molecules, neutrals, radicals) have been found quite useful for providing the necessary reactive assistance.

Some form of mask is required to protect desired regions of a GaAs surface (which may or may not contain a deposited overlayer) when the surface is subjected to an etch process, either wet or dry. Masks which are "durable" and "process integrable" are of particular value.

The term "durable" as used herein defines the resistance of the mask to erosion during an etch process. An ideal mask is durable to the extent it will not erode or change form during an etch process. For a mask to exhibit significant durability in the etch processing of GaAs, the ratio of the etch rate of the GaAs to that of the mask, i.e., the selectivity of the etch, must be high. Masks of materials of low durability are unsuitable for several reasons. First, the edge quality of etch features decreases as mask thickness increases. Second, mask features with lateral dimensions smaller than the thickness of the mask are unstable and can break away or shift position during processing. Finally, during dry etch processing, mask erosion, especially of edges, can redeposit mask material into unwanted regions and degrade overall etch quality and uniformity.

For a mask to be "process integrable" the mask must be capable of withstanding a variety of process steps in the processing of GaAs beyond those directly associated with dry etch processing. These steps would include; thermal processes which challenge the adhesion and stability of the mask and various cleaning processes in solutions containing acids, bases or solvents which challenge the reactivity of the mask. A process integrable mask, in summary, is a mask suitable for insertion into a process sequence without introducing contamination or becoming ineffective. It also must be easy to remove.

In the dry etch processing of GaAs using chlorine for chemical assistance, few materials are known which when applied as thin layers (ca. 0.1 um) offer the durability to survive an etch of from a few to many microns. Metals such as nickel (with titanium underlayer) and chromium and salts such as aluminum fluoride and strontium fluoride have been used with varying degrees of success. Wet techniques are frequently required following dry etch processing to effect complete removal of these materials. A definite need exists for dry etch masks of high durability which are convenient to apply, pattern, and remove.

SUMMARY OF THE INVENTION

An object of the present invention is to provide a durable mask which is process integrable and capable of protecting desired regions of a GaAs surface (which may or may not contain a deposited overlayer) during dry etch processing.

Another object of this invention is to provide a method for depositing this mask which is compatible with lift-off lithographic processing.

A further object of this invention is to provide a method for patterning deposited overlayers on GaAs and aligning said overlayers with etch features produced by dry processing.

Quite unexpectedly, we have discovered that a mask of hydrogenated amorphous carbon is highly resistant to attack by chlorine during dry etch processing in chlorine containing ambients. The inert nature of hydrogenated amorphous carbon to most chemistries during wet etch processing is also well known. We have discovered also that a mask of hydrogenated amorphous carbon can be prepared which is sufficiently stable and adherent to withstand the thermal process steps used typically in the fabrication of optical, electronic, and optoelectronic devices in GaAs. The above objects are achieved in a method of forming patterns in deposited overlayers on GaAs and aligning said patterns with etch features comprising the steps of:

(a) applying a patternable layer on GaAs for use as a mask;

(b) patterning said layer for use in lift-off processing to provide a mask having a first set of spaced openings;

(c) depositing a first layer on top of this patterned mask and in the first set of spaced openings;

(d) depositing a second layer on top of the first layer where the second layer is a durable, process integrable mask of hydrogenated amorphous carbon;

(e) removing the lift-off mask to provide a second set of openings offset in space from the first;

(f) dry etching the GaAs substrate through such openings; and (g) removing the second deposited layer of hydrogenated amorphous carbon.

Other objects and advantages of the present invention shall become evident through the accompanying description, drawings and example.

DETAILED DESCRIPTION OF THE PREFERRED EMBODIMENT

A mask of amorphous carbon can be prepared by a variety of techniques over a wide range of process conditions. Some of the most common techniques which are useful for preparing this material include: plasma-assisted CVD, i.e., the plasma decomposition of a hydrocarbon, and variations; glow discharge (rf and dc) sputter deposition; single and dual ion beam sputter deposition; reactive ion beam deposition; evaporation; and ion plating. Depending on the deposition technique and conditions selected, the chemical and physical properties of the amorphous carbon will vary; the chemical properties from amorphous carbon (a-C) to hydrogenated amorphous carbon (a-C:H), the physical properties from diamond-like to graphite-like. The hydrogen content of hydrogenated amorphous carbon is typically between 5 and 60 atomic percent.

Hydrogenated amorphous carbon which serves as a durable mask is determined easily through routine examination using, for example, scanning electron microscopy (SEM), from data obtained by experiment.

To be considered highly durable, the ratio of the etch rate of GaAs to that of the mask should exceed 50:1 or more typically, 75-100:1. For dry etch processes in chlorine containing ambients, the etch rate of GaAs to that of the mask has been found to exceed 100:1. Chlorine containing gases or gas mixtures other than those given by the example, e.g., $BCl_3$, $BCl_3/Ar$, etc., may be useful also as long as the ambient is a suitable ambient for the dry etch processing of GaAs. With an etch rate ratio of 100:1 a mask of hydrogenated amorphous carbon, 0.1 microns thick, can be expected to withstand etch processes which remove up to 10 microns of GaAs. A mask of this thickness would easily permit the lithographic patterning of features with widths as small as 0.1 micron.

Figure 1:
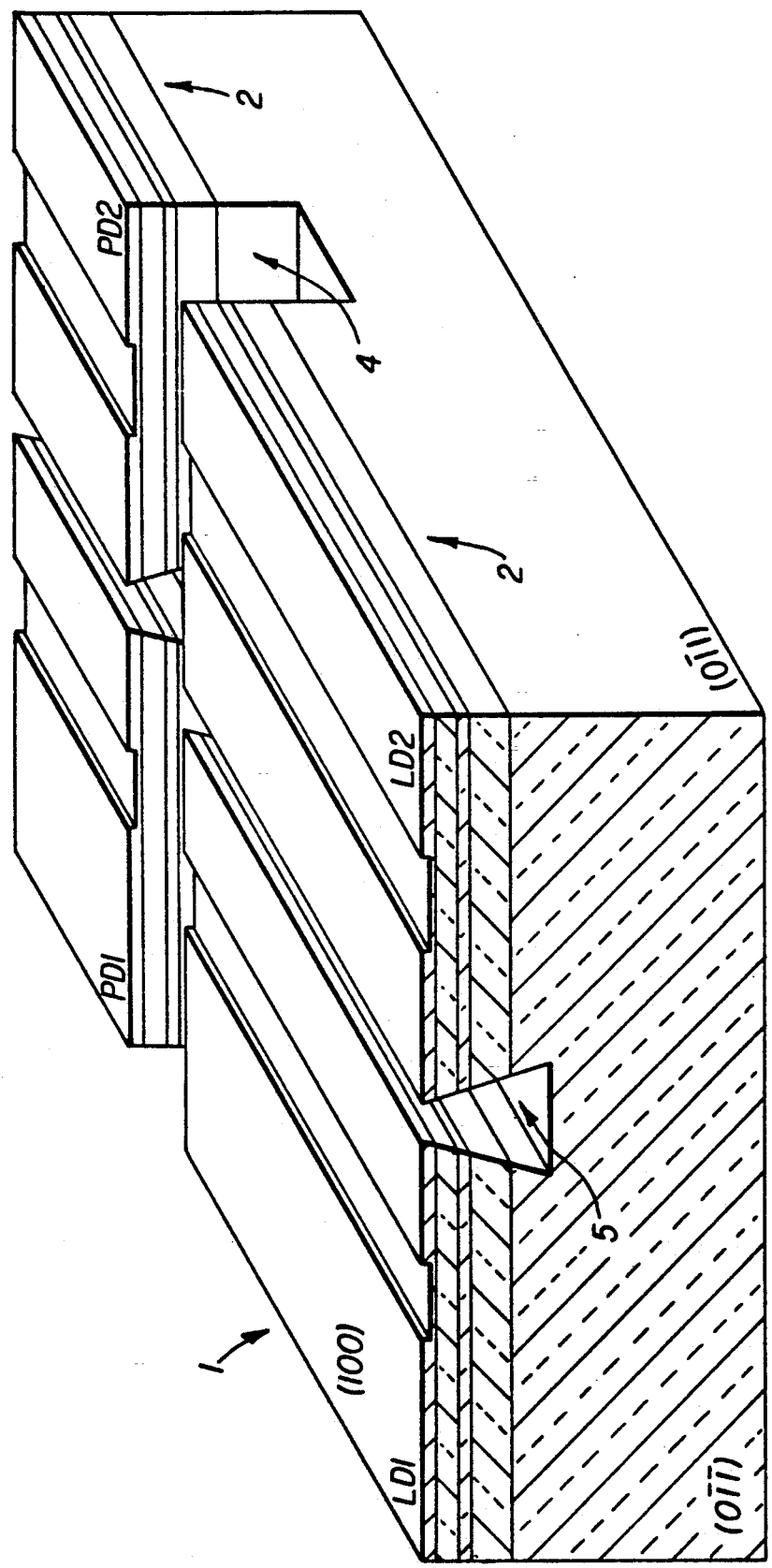
FIG. 1 is a perspective which illustrates an example of device structures in GaAs which can be fabricated in accordance with the present invention, (in this example multiple pairs of laser diode emitters and photodiode detectors are fabricated on a single substrate)
Figure 2A:
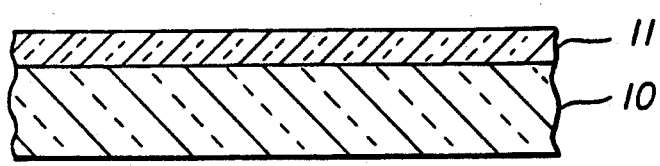
FIGS. 2a-2h are sectional views illustrating steps in the preferred method of forming and aligning with dry etch features patterns in deposited overlayers on GaAs, e.g., top surface electrical contacts such as those depicted on the device structures of FIG. 1.
Figure 2B:
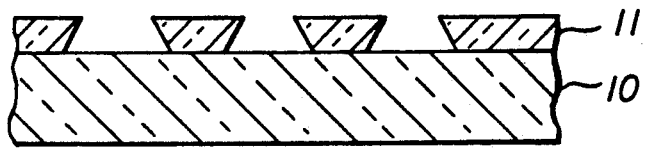
Figure 2C:
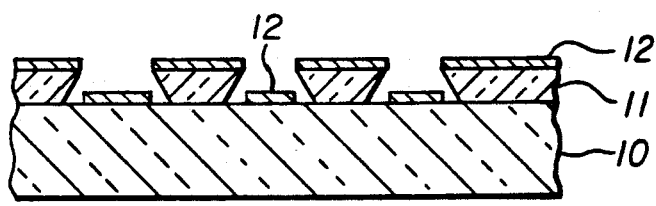
Figure 2D:
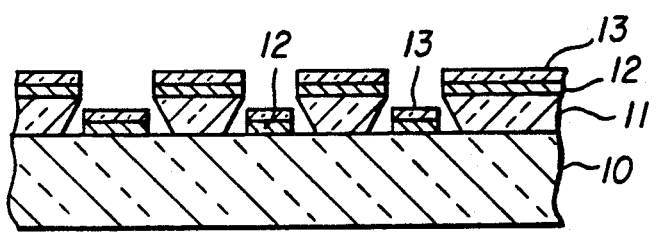
Figure 2E:
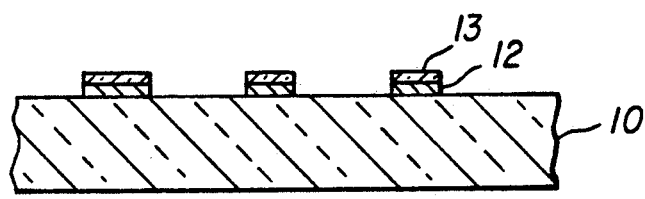
Figure 2F:
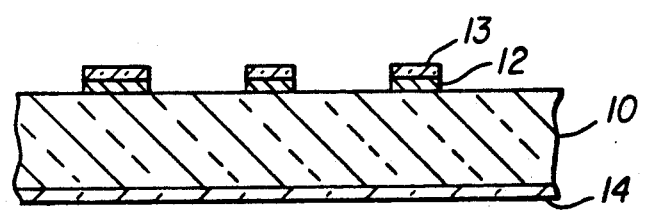
Figure 2G:
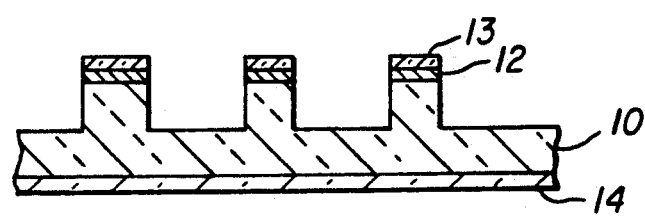
Figure 2H:
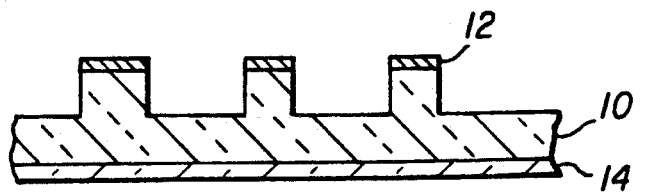

An example which illustrates use of the present invention is described in detail below. In this example multiple pairs of laser diode emitters and photodiode detectors are fabricated on a single substrate. The electrical contacts to these devices are aligned between both dry and wet etch features; dry etch features in one dimension, wet etch features in the other. A view of a substrate containing such devices is shown in FIG. 1. In this figure the top electrical contacts 1 to the laser diode emitters 2 and photodiode detectors 2 are shown aligned with etch facets 4 formed through dry etch processing. (The laser diode emitters and photodiode detectors are identical structures in this figure.) Use of a dry etch process provides the anisotropy needed to obtain facets with near vertical walls. Dry processing is not required, however, to form etch features in GaAs for all applications. In this example the isolation (both electrical and optical) of adjacent pairs of devices was achieved through use of features 5 having re-entrant profiles formed by wet etch processing along the [011] direction of GaAs (100). Deposition of metal overlayers through a line of sight deposition process produced top surface electrical contacts which aligned directly with the features formed by the wet etch processing. The alignment of the contacts to these, i.e., wet etch, features is not part of the present invention.

Use of the present invention to pattern overlayers on GaAs and to align the overlayers with etch features produced by dry etch processing is illustrated in FIG. 2. Reference is made in describing this figure to the example depicted in FIG. 1 where the overlayers are top surface electrical contacts. In FIG. 2a, a layer of lithographically patternable material 11, e.g., photoresist or electron beam sensitive resist, is shown applied over the surface of a GaAs substrate 10. The region of GaAs covered by this layer is assumed to be appropriate, i.e., suitably doped (typical p-dopant concentrations greater than or equal to $1\times10^{19}/cm^3$), to accommodate an appropriate electrical contact. This layer 11 is patterned according to accepted practices to provide a mask with a first set of spaced openings with features suitable for lift-off processing as shown in FIG. 2b. One or more layers 12 of material suitable for use as an electrical contact on GaAs is applied over both the features 11 and in openings in the mask onto substrate 10 (FIG. 2c). A layer of hydrogenated amorphous carbon 13 is applied over this, i.e., contact, layer(s) to form a durable, process integrable mask (FIG. 2d). The features 11 with the contact and hydrogenated amorphous carbon overlayers are removed by lift-off processing providing a second set of openings to the substrate 10 which are offset in space from the first (FIG. 2e). An anneal of the contact overlayer 12 and the underlying GaAs is performed to produce an ohmic contact. At this point the backside of the substrate is prepared (lapped and polished, if necessary) for application of a backside contact. The backside contact 14, which consists of one or more layers, is applied (FIG. 2f) and annealed (again to produce an ohmic contact with the substrate). Next, the front surface of the substrate is subjected to a dry etch, either a Reactive Ion Etch (RIE) or a Chemically-Assisted Ion Beam Etch (CAIBE), in a chlorine containing ambient to form the desired features (FIG. 2g). In this etch the hydrogenated amorphous carbon layer 13 is the mask which protects the underlying contact layer 12 and substrate. Following this etch the substrate is subjected to another RIE using oxygen $O_2$ to remove the hydrogenated amorphous carbon 13. The electrical contacts patterned by this process are self-aligned with the newly formed etch features (FIG. 2h). Alternative dry etch techniques may be substituted for any of the RIE steps specified above if more convenient.

EXAMPLE

Figures 3, 4:
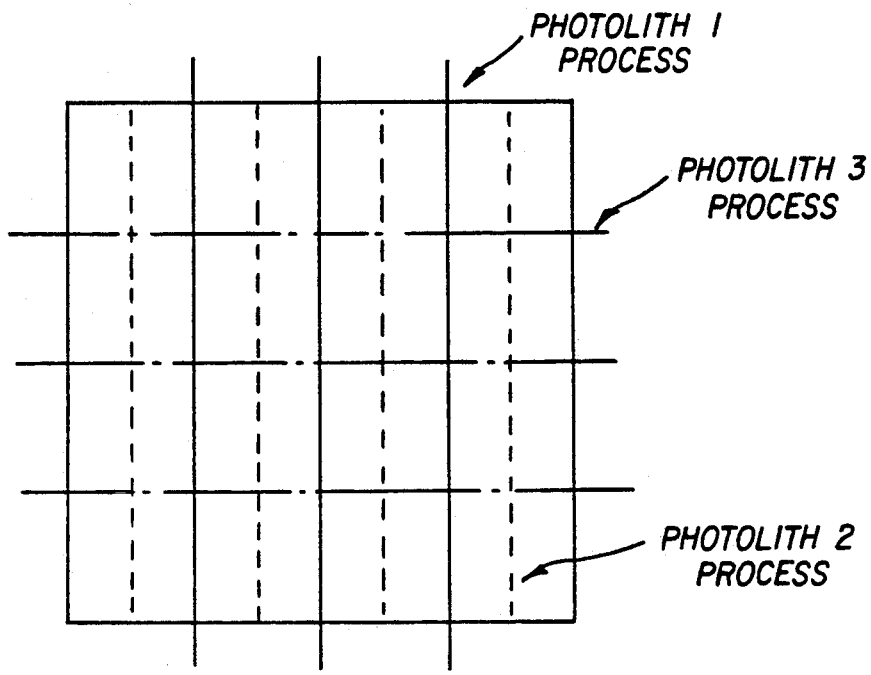
FIG. 3 is a topographic view illustrating the lithographic process steps used to form and align with etch features the top surface electrical contacts in making the device depicted in FIG. 1.
FIG. 4 is a sectional view illustrating the epitaxial layer structure of the GaAs material used for the fabrication of the device structures depicted in FIG. 1.

Application of the present invention is described in detail as it applies to the example depicted in FIG. 1. In this example a 2 inch diameter wafer of n-type GaAs (100) with $n \geq 10^{18}/cm^3$ having the epitaxial layer structure shown in FIG. 4 was cleaved into a number of $1 \times 1$ $cm^2$ substrates. These substrates were cleaned using procedures well known to those skilled in the art and coated with a layer of $Si_3N_4$ (0.245 microns thick) via PECVD (plasma enhanced chemical vapor deposition; 48 mw/$cm^2$, 13.56 MHz using $SiH_4$ (9.6 sccm) and $N_2$ (81 sccm) at a total pressure of 610 mTorr and a temperature of 380° C. A photolithography step (Photolith #1 in FIG. 3) followed to form the device isolation pattern. The stripes formed by this lithography step were aligned along the [011] direction. The $Si_3N_4$ on the surface of the GaAs between the stripes was removed by RIE at 0.55 W/$cm^2$ in CHF (45 sccm) and $O_2$ (5 sccm) at a pressure of 80 mTorr. A wet etch followed using $H_2SO_4:H_2O_2:H_2O$ (1:8:8) at 7° C. for 4 minutes to form features in the substrate 6–8 microns deep having a re-entrant profile such as 5 in FIG. 1. The photoresist from Photolith #1 was removed, the substrates were cleaned, and the photoresist for a second photolithography step, Photolith #2, was applied. This resist was patterned as indicated in FIG. 3 opening up windows for a Zn diffusion process step. This was followed by another RIE in $CHF_3O_2$ to remove the $Si_3N_4$ layer between the stripes (using the same conditions as before). After this RIE the photoresist from Photolith #2 was removed and the substrates were cleaned and etched in $HCl:H_2O$ (1:1) for 60 seconds at 23° C. A coating of $ZnO_x/SiO_{1-x}$ was applied with a cap layer of $SiO_2$ and annealed at 650° C. for 40 minutes to effect Zn diffusion into the substrate to form p-doped regions ($p >= 10^{19}/cm^3$). The residual zinc silicate and $SiO_2$ cap were next removed by wet etching in BOE for 60 seconds. A rinse followed in $HCl:H_2O$ (1:1) for 60 seconds to remove all surface oxide. The substrates were again cleaned and photoresist for a third photolithography step, Photolith #3, was applied. This resist was patterned as indicated in FIG. 3 with features perpendicular to the stripes formed during the previous photolithography steps, Photolith #1 and Photolith #2. The resist in this step was treated to permit use of Imidazole based lift-off process. The substrates were cleaned and etched in $H_3PO_4:H_2O_2:H_2O$ (3:1:100) for 30 seconds and in $HCl:H_2O$ (1:1) for 60 seconds (both at room temperature). The electrical contact to the p-doped regions was then vapor deposited via e-beam. This contact was composed of layers of Ti (0.07 micron thick), Pt (0.04 micron thick), Au (0.2 micron thick), Pt (0.04 micron thick), and Ti (0.04 micron thick). A layer of hydrogenated amorphous carbon (0.1 micron thick) was deposited over the top of this metal overlayer by the plasma-assisted CVD technique (substrates placed on the powered electrode, 800V self-bias, 1 mTorr $CH_4$). The outermost 0.04 micron thick layer of Ti served as an adhesion layer for the carbon. Following lift-off of the features from Photolith #3 the wafer was annealed via a rapid thermal process (500° C. for 60 seconds in dry nitrogen) to produce an ohmic contact between the p-doped GaAs and the metal. The backside of the substrates was next lapped, polished and prepared (using the same pre-metal clean and etch as above) for deposition of the backside electrical contact (to n-GaAs). The backside metal comprising layers of Ni (0.005 micron thick), AuGe (0.1 micron thick) and Ni (0.1 micron thick) was vapor deposited and rapid thermal annealed (400° C. for 30 seconds in dry nitrogen) to make the contact ohmic. The $Si_3N_4$ exposed after removal of the lift-off features from Photolith #3 was removed by RIE (using the same conditions as in Photolith #1). Chemically-assisted ion beam etching (CAIBE) was used to etch the facets (4 in FIG. 1) between the laser and photodiodes in the GaAs substrate under the following conditions: Kauffman source, Ar flow, 3 sccm; chlorine flow, 12 sccm; pressure, $2\times10^{-4}$ Torr; voltage, 500 V; current density, 0.4 ma/$cm^2$; and substrate temperature, 115° C. The top electrical contacts (1 in FIG. 1) were self-aligned in one dimension with the facets produced by CAIBE. In the other dimension the contacts were isolated by the re-entrant device isolation stripes (5 in FIG. 1) formed after Photolith #1. RIE at 0.41 W/$cm^2$ in $O_2$ at a pressure of 40 mTorr was used to remove the remaining layer of hydrogenated amorphous carbon and RIE at 0.41 W/$cm^2$ in $CF_4/O_2$ (96 vol % $CF_4$, 4 vol % $O_2$) at a pressure of 100 mTorr was used to remove the outermost (0.04 micron thick) Ti layer from the p-contact. Leads were connected to the p and n contacts to test the devices. The final topography of the substrates with the laser diode emitter-photodiode detector pairs is as illustrated in FIG. 1.

The invention has been described in detail with particular reference to a certain preferred embodiment thereof, but it will be understood that variations and modifications can be effected within the spirit and scope of the invention.

What is claimed is:

1. A method of forming patterns in deposited overlayers on GaAs and aligning said patterns with etch features comprising the steps of:
   (a) applying a patternable layer on GaAs for use as a mask;
   (b) patterning said layer for use in lift-off processing to provide a mask having a first set of spaced openings;
   (c) depositing a first layer on top of this patterned mask and in the first set of spaced openings;
   (d) depositing a second layer on top of the first layer wherein the second layer is a durable, process integrable mask of hydrogenated amorphous carbon;
   (e) removing the lift-off mask to provide a second set of opening offset in space from the first;
   (f) dry etching the GaAs substrate through such second set of openings; and
   (g) removing the second deposited layer of hydrogenated amorphous carbon.

2. The method of claim 1 wherein the first deposited layer contains two or more layers of similar or different materials.

3. The method of claim 1 wherein the first deposited layer contains the following layer structure, Ti-Pt-Au-Pt-Ti.

4. The method of claim 1 wherein the hydrogenated amorphous carbon is resistant to attack by;
   (i) acids, bases or solvents during wet etch processing; and
   (ii) energetic ions in chlorine containing ambients during dry etch processing.

5. The method of claim 1 wherein the hydrogenated amorphous carbon is not made ineffective as a mask by;
   (i) thermal processing to temperatures of 600° C. in the absence of oxygen;
   (ii) wet chemical processing in acids, bases, or solvents.

6. The method of claim 1 wherein the dry etch processing is performed in chlorine containing ambients.

7. The method of claim 1 wherein the hydrogenated amorphous carbon is removed by dry processing.

* * * * *